(12) United States Patent
Song et al.

(10) Patent No.: US 9,048,307 B2
(45) Date of Patent: Jun. 2, 2015

(54) **METHOD OF MANUFACTURING A SEMICONDUCTOR DEVICE HAVING SEQUENTIALLY STACKED HIGH-*K* DIELECTRIC LAYERS**

(75) Inventors: Jae-Yeol Song, Seoul (KR); Jeong-Hee Han, Hwaseong-si (KR); Sang-Jin Hyun, Suwon-si (KR); Hyeok-Jun Son, Seoul (KR); Sung-Kee Han, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 208 days.

(21) Appl. No.: 13/517,756

(22) Filed: Jun. 14, 2012

(65) Prior Publication Data
US 2012/0319216 A1    Dec. 20, 2012

(30) Foreign Application Priority Data
Jun. 20, 2011    (KR) .......................... 10-2011-0059792

(51) Int. Cl.
*H01L 21/336*    (2006.01)
*H01L 29/78*    (2006.01)

(52) U.S. Cl.
CPC ..................................... *H01L 29/78* (2013.01)

(58) Field of Classification Search
None
See application file for complete search history.

(56) References Cited

U.S. PATENT DOCUMENTS

| | | | |
|---|---|---|---|
| 2005/0074978 A1* | 4/2005 | Wang et al. | 438/706 |
| 2009/0261412 A1* | 10/2009 | Saito et al. | 257/347 |
| 2010/0059834 A1* | 3/2010 | Dubourdieu et al. | 257/410 |
| 2010/0178744 A1 | 7/2010 | Takahashi et al. | |
| 2010/0195293 A1* | 8/2010 | Shirakawa et al. | 361/748 |
| 2012/0139062 A1* | 6/2012 | Yuan et al. | 257/411 |
| 2013/0292778 A1* | 11/2013 | Cartier et al. | 257/369 |

FOREIGN PATENT DOCUMENTS

| | | |
|---|---|---|
| JP | 2009-111072 | 5/2009 |
| JP | 2010-165705 | 7/2010 |
| KR | 10-2005-0033323 | 4/2005 |

* cited by examiner

*Primary Examiner* — Charles Garber
*Assistant Examiner* — Brigitte Paterson
(74) *Attorney, Agent, or Firm* — Onello & Mello, LLP

(57) ABSTRACT

A semiconductor device having reduced leakage current and increased capacitance without increasing an equivalent oxide thickness (EOT) can be manufactured by a method that includes providing a substrate having a dummy gate pattern; forming a gate forming trench by removing the dummy gate pattern; forming a stacked insulation layer within the gate forming trench, wherein the forming of the stacked insulation layer includes forming a first high-k dielectric layer, forming a second high-k dielectric layer by performing heat treatment on the first high-k dielectric layer, and, after the heat treatment, forming a third high-k dielectric layer on the second high-k dielectric layer, the third high-k dielectric layer having a higher relative permittivity than the second high-k dielectric layer and having a dielectric constant of 40 or higher; and forming a gate electrode within the gate forming trench.

15 Claims, 14 Drawing Sheets

METHOD OF MANUFACTURING A SEMICONDUCTOR DEVICE HAVING SEQUENTIALLY STACKED HIGH-$K$ DIELECTRIC LAYERS

CROSS-REFERENCE TO RELATED APPLICATION

This application claims priority from Korean Patent Application No. 10-2011-0059792, filed on Jun. 20, 2011 in the Korean Intellectual Property Office, and all of the benefits accruing therefrom under 35 U.S.C. 119, the contents of which in its entirety are herein incorporated by reference.

BACKGROUND

1. Field of the Inventive Concepts

The present inventive concepts relate to a method for manufacturing a semiconductor device.

2. Description of the Related Art

Silicon dioxide ($SiO_2$) has been used as a gate dielectric; and as the integration density of semiconductor devices has recently been increasing, the thickness of the gate insulation layer should be continuously scaled down. Silicon dioxide has a low dielectric constant (k) of approximately 3.9, however; consequently, further scaling down of the silicon dioxide gate dielectric layer has become more and more difficult. In addition, thinning the silicon dioxide gate dielectric layer may cause direct tunneling between the semiconductor substrate and the gate electrode. As a result, the leakage current through the reduced-thickness silicon dioxide gate dielectric layer may increase.

Accordingly, recent studies have been directed to using a high-k dielectric layer as a gate dielectric, which is capable of reducing the thickness of the high-k dielectric layer compared to that of a silicon oxide layer used while maintaining the thickness at a level sufficient to prevent direct tunneling. Where the high-k dielectric layer is used as the gate dielectric, however, electron and hole mobility in a channel may decrease as leakage current is generated.

SUMMARY

The present inventive concepts provide a method for manufacturing a semiconductor device having a reduced leakage current and increased capacitance without increasing an equivalent oxide thickness (EOT), as will be described in or be apparent from the following description of particular embodiments.

According to an aspect of the present inventive concepts, a semiconductor device is manufactured by a method including providing a substrate having a dummy gate pattern and forming a gate-forming trench by removing the dummy gate pattern. A stacked insulation layer is then formed within the gate-forming trench, wherein forming the stacked insulation layer includes forming a first high-k dielectric layer; forming a second high-k dielectric layer by performing a heat treatment on the first high-k dielectric layer; and, after the heat treatment, forming a third high-k dielectric layer on the second high-k dielectric layer. The third high-k dielectric layer has a higher relative permittivity than the second high-k dielectric layer and has a dielectric constant of 40 or higher. Additionally, a gate electrode is formed within the gate-forming trench.

According to another aspect of the present inventive concepts, a semiconductor device is manufactured by a method including forming an amorphous first high-k dielectric layer, forming a second high-k dielectric layer by crystallizing the first high-k dielectric layer, and forming an amorphous third high-k dielectric layer containing titanium on the second high-k dielectric layer.

According to still another aspect of the present inventive concepts, a semiconductor device includes a gate insulation layer formed on a substrate, and a gate electrode formed on the gate insulation layer, wherein the gate insulation layer has a stacked structure including a crystalline second high-k dielectric layer and a third high-k dielectric layer sequentially stacked. The third high-k dielectric layer has a higher relative permittivity than the second high-k dielectric layer and has a dielectric constant of 40 or higher.

The substrate may include silicon on insulator, gallium arsenic, silicon germanium, a ceramic material, quartz, and/or a display glass. The first high-k dielectric layer may be stacked in an amorphous state and crystallized by the heat treatment to form the second high-k dielectric layer; and the second high-k dielectric layer may include a crystal form selected from a monoclinic crystal system, a tetragonal crystal system, a hexagonal crystal system and a cubic system, either alone or in combination and may be formed of an an oxide of at least one of Hf, Zr, Al, La, Y, Gd and Ta. Meanwhile, the first high-k dielectric layer may include hafnium oxide, and the third high-k dielectric layer may include titanium oxide, titanium strontium oxide or barium titanium oxide and may be formed in an amorphous state and may be in direct contact with the second high-k dielectric layer.

Additionally, an interlayer interface layer may be formed between the substrate and the first high-k dielectric layer; and the interlayer interface layer may be selected from silicon oxide, silicon oxynitride and metal silicate oxide, either alone or in combination. Formation of the interlayer interface layer may include oxidizing a predetermined region of the substrate. In other embodiments, formation of the interlayer interface layer may include injecting nitrogen into the oxide layer after forming an oxide layer by oxidizing the predetermined region of the substrate.

As described above, the semiconductor device manufactured by this method can have a reduced leakage current without increasing the EOT. In addition, a semiconductor device can be formed via this method with an insulation layer without a deterioration in its performance as a metal-oxide-semiconductor field-effect transistor (MOSFET).

BRIEF DESCRIPTION OF THE DRAWINGS

The above and other features and advantages of the present inventive concepts will become more apparent by describing in detail particular embodiments thereof with reference to the attached drawings in which.

DETAILED DESCRIPTION OF EMBODIMENTS

Figure 1:
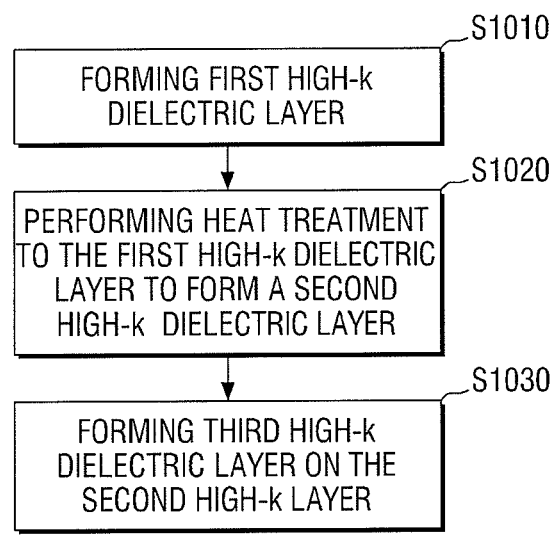
FIG. 1 is a flowchart sequentially illustrating exemplary processing steps in a method for manufacturing a semiconductor device according to a first embodiment of the present inventive concepts.

Embodiments of the present inventive concepts will now be described more fully hereinafter with reference to the accompanying drawings. These inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

The use of the terms, "a" and "an" and "the" and similar referents, in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as that which is commonly understood by one of ordinary skill in the art to which these inventive concepts belong. The use of any and all examples, or exemplary terms provided herein is intended merely to better illuminate the inventive concepts and is not a limitation on the scope of the inventive concepts unless otherwise specified. Further, unless defined otherwise, all terms defined in generally used dictionaries may not be interpreted overly rigidly.

The present inventive concepts will be described with reference to perspective views, cross-sectional views, and/or plan views, in which preferred embodiments of the inventive concepts are shown. Thus, the profile of an exemplary view may be modified according to manufacturing techniques and/or allowances. That is, the embodiments of the inventive concepts are not intended to limit the scope of the present inventive concepts but cover all changes and modifications that can be caused due to a change in manufacturing process. Thus, regions shown in the drawings are illustrated in schematic form and the shapes of the regions are presented simply by way of illustration and not as a limitation.

Hereinafter, the present inventive concepts will be described with reference to exemplary embodiments and the accompanying drawings.

Figure 3:
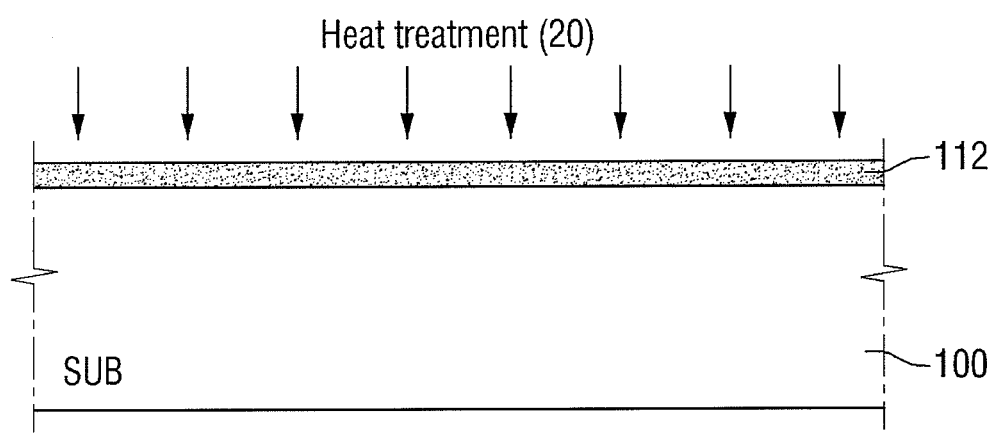
Figure 4:
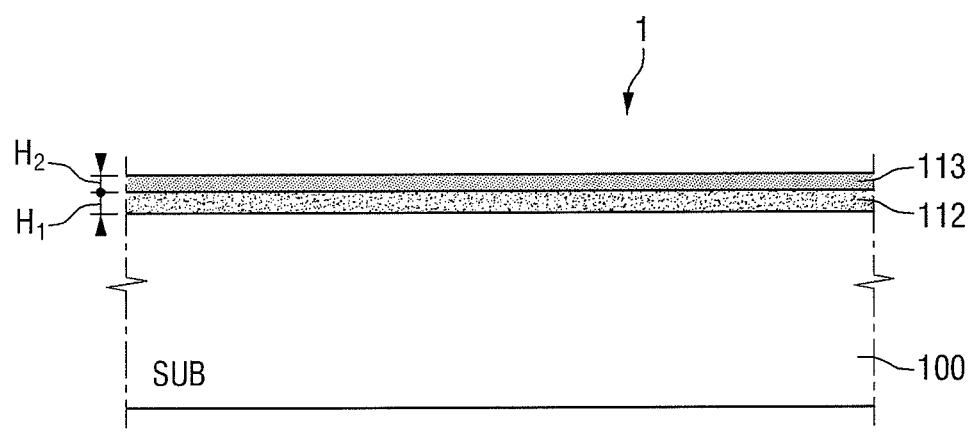

First, a method for manufacturing a semiconductor device according to a first embodiment of the present inventive concepts will be described with reference to FIGS. 1 to 4. FIG. 1 is a flowchart sequentially illustrating exemplary processing steps in a method for manufacturing a semiconductor device according to a first embodiment of the present inventive concepts, and FIGS. 2 to 4 are cross-sectional views illustrating intermediate structures in the manufacture of a semiconductor device according to the first embodiment of the present inventive concepts.

Figure 2:
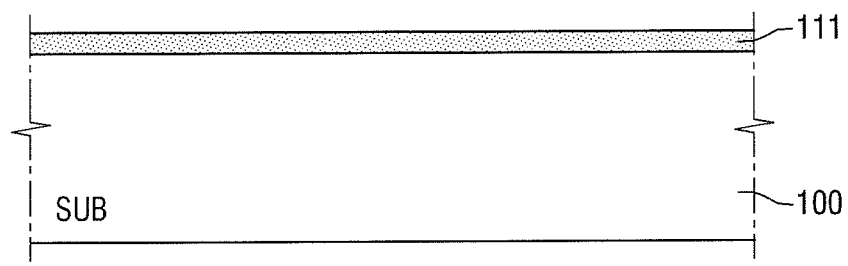
FIGS. 2 to 4 are cross-sectional views illustrating intermediate structures in the manufacture of a semiconductor device according to the first embodiment of the present inventive concepts.

Referring to FIGS. 1 and 2, a first high-k dielectric layer 111 is formed on a substrate 100 (S1010). Specifically, the first high-k dielectric layer 111 may be formed in an amorphous form on the substrate 100 by depositing a material having a higher dielectric constant.

The substrate 100 may be a silicon substrate, a silicon on insulator (SOI) substrate, a gallium arsenic substrate, a silicon germanium substrate, a ceramic substrate, a quartz substrate, and a display glass substrate, but is not limited thereto. In addition, the semiconductor substrate 100 may be a P-type or N-type substrate. Although not shown, the substrate 100 may include a P-type well doped with p-type dopant or an N-type well doped with n-type dopant.

The first high-k dielectric layer 111 may be formed of a material having a higher dielectric constant, at least 8, than a silicon oxynitride layer and generally has a dielectric constant of 10 or higher. Examples of the high-k dielectric layer 111 may include, but are not limited to, hafnium oxide, hafnium silicon oxide, lanthanum oxide, lanthanum aluminum oxide, zirconium oxide, zirconium silicon oxide, tantalum oxide, yttrium oxide, aluminum oxide, lead scandium tantalum oxide, and lead zinc niobate, either alone or in a mixture thereof. The thickness of the high-k dielectric layer 111 may be about 30 Å or under. In addition, the high-k dielectric layer 111 may have a single- or multi-layered structure including the above-stated materials; and the structure type or thickness of the high-k dielectric layer 111 may be adjusted by one skilled in the related art. Specifically, the first high-k dielectric layer 111 may be formed of hafnium oxide. More specifically, the first high-k dielectric layer 111 may be formed of hafnium oxide having a dielectric constant of 10 to 30.

The first high-k dielectric layer 111 may be formed by deposition, such as chemical vapor deposition (CVD), atomic layer deposition (ALD) or physical vapor deposition (PVD). For example, if the first high-k dielectric layer 111 is formed by ALD, a metal source gas, such as Hf, Zr, Al, La, Y, Gd or Ta, is injected into a chamber having the substrate 100 and is adsorbed into the substrate 100. Thereafter, a purge gas is injected to remove the remaining portion of the source gas that is not adsorbed. An inert gas, such as nitrogen ($N_2$) gas or argon (Ar) gas, may be used as the purge gas. Next, a reaction gas is supplied to react with the metal source gas, thereby forming a high-k dielectric layer. Next, a reaction gas is injected to react with the metal source gas to form the high-k dielectric layer. Ozone ($O_3$), plasma oxygen, or water vapor ($H_2O$) may be used as the reaction gas. The first high-k dielectric layer 111 may be formed by repeating the above-stated process several times.

Referring to FIGS. 1 and 3, a second high-k dielectric layer 112 is formed by performing a heat treatment 20 on the first high-k dielectric layer 111 (S1020). The heat treatment 20 may crystallize the first high-k dielectric layer 111. Since the second high-k dielectric layer 112 includes crystals, it becomes densified and dangling bonds are reduced. Consequently, leakage current is reduced.

The heat treatment 20 may be performed at a temperature in a range of 400 to 1400° C. and may be performed by furnace annealing, rapid thermal annealing (RTA), spike rapid thermal annealing (SRTA), flash rapid thermal process (FRTP), or laser annealing, but is not limited thereto. The duration of the heat treatment 20 may be about 60 minutes or under. But is not limited thereto, and that may be appropriately adjusted by one skilled in the art.

The second high-k dielectric layer 112 may include crystalline forms selected from a monoclinic crystal system, a tetragonal crystal system, a hexagonal crystal system and a cubic system, either alone or in combination (e.g., mixture). In addition, since the heat treatment 20 increases relative permittivity, the second high-k dielectric layer 112 may have a larger relative permittivity than the first high-k dielectric layer 111 in an amorphous state.

Referring to FIGS. 1 and 4, a third high-k dielectric layer 113 is formed on the second high-k dielectric layer 112 (S1030). In detail, the third high-k dielectric layer 113 is stacked in an amorphous state on the second high-k dielectric layer 112.

The third high-k dielectric layer 113 may be made of a material having a larger dielectric constant or relative permittivity than the second high-k dielectric layer 112. Since the third high-k dielectric layer 113 is formed on the second high-k dielectric layer 112 using a material having a larger dielectric constant or relative permittivity than the second high-k dielectric layer 112, leakage current is reduced without increasing an equivalent oxide thickness (EOT).

The third high-k dielectric layer 113 may be made of a material having a dielectric constant of 40 or higher. If the high-k dielectric layer is made of a material having a high dielectric constant, the EOT may be reduced. In this case, however, the leakage may increase; thus, there is a limitation in reducing the EOT. However, in a case where the high-k dielectric layer has a stacked structure in which a third high-k dielectric layer 113 having a dielectric constant of 60 or higher is formed on the second high-k dielectric layer 112, the leakage current may be reduced without increasing the EOT.

Specifically, the third high-k dielectric layer 113 may include titanium oxide ($TiO_x$), titanium strontium oxide ($SrTiO_x$), or barium titanium oxide ($BaTiO_x$). For example, titanium oxide ($TiO_x$) has a dielectric constant of approximately 40, titanium strontium oxide ($SrTiO_x$) has a dielectric constant of approximately 170, and barium titanium oxide ($BaTiO_x$) has a dielectric constant of approximately 90. Thus, the EOT can be reduced. In a case of the third high-k dielectric layer 113 is made of titanium oxide, if heat treatment is simultaneously performed on the first high-k dielectric layer 111 and the third high-k dielectric layer 113 after forming the third high-k dielectric layer 113, an oxide layer having lower relative permittivity may be formed under the first high-k dielectric layer 111 due to migration of oxygen ions contained in titanium oxide, thereby increasing the EOT. In this embodiment, before forming the third high-k dielectric layer 113 made of titanium oxide, the first high-k dielectric layer 111 is subjected to heat treatment to form the second high-k dielectric layer 112 while the third high-k dielectric layer 113 is not subjected to heat treatment, thereby preventing the EOT from increasing.

The third high-k dielectric layer 113 may be stacked by deposition, such as chemical vapor deposition (CVD), atomic layer deposition (ALD) or physical vapor deposition (PVD). The thickness, $H_2$, of the third high-k dielectric layer 113 may be smaller than the thickness, $H_1$, of the second high-k dielectric layer 112. As a material's dielectric constant is increased, the band gap energy thereof tends to decrease, which may cause the leakage current to increase. Therefore, if the third high-k dielectric layer 113 with large relative permittivity is too thick, the leakage current may increase. In this embodiment, the second high-k dielectric layer 112 is formed more thickly than the third high-k dielectric layer 113, thereby reducing the leakage current while maintaining the EOT.

A semiconductor device manufactured by the method of the first embodiment of the present inventive concepts will be described with reference to FIG. 4.

The semiconductor device 1 according to the first embodiment of the present inventive concepts includes a crystalline second high-k dielectric layer 112 formed on a substrate 100 and a third high-k dielectric layer 113 formed on the second high-k dielectric layer 112. The third high-k dielectric layer 113 has a larger relative permittivity than the second high-k dielectric layer 112. Here, the crystalline second high-k dielectric layer 112 may be formed by performing a heat treatment on the first high-k dielectric layer 111 stacked on the substrate 100. Specifically, the second high-k dielectric layer 112 may be formed of crystalline hafnium oxide; and the third high-k dielectric layer may be formed of amorphous titanium oxide. Since the semiconductor device 1 manufactured according to an embodiment of the present inventive concepts includes the crystalline second high-k dielectric layer 112 and the amorphous third high-k dielectric layer 113 having a larger relative permittivity than that of the second high-k dielectric layer 112, the leakage current can be reduced without increasing the EOT, compared to the case of forming a single layer formed of only the second high-k dielectric layer 112.

Figure 5:
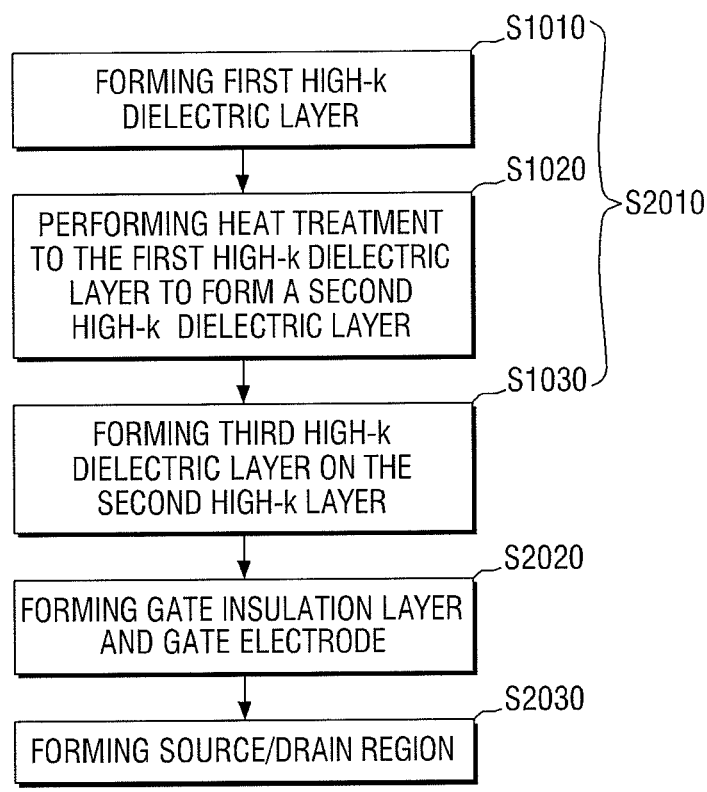
FIG. 5 is a flowchart sequentially illustrating exemplary processing steps in a method for manufacturing a semiconductor device according to a second embodiment of the present inventive concepts.

Hereinafter, a method for manufacturing a semiconductor device according to a second embodiment of the present inventive concepts will be described with reference to FIGS. 5 to 11. FIG. 5 is a flowchart sequentially illustrating exemplary processing steps in the manufacture of a semiconductor device according to a second embodiment of the present inventive concepts, and FIGS. 6 to 11 are cross-sectional views illustrating intermediate structures in the manufacture of a semiconductor device according to the second embodiment of the present inventive concepts. The semiconductor device according to the second embodiment of the present inventive concepts can be manufactured using the method by which the first embodiment of the semiconductor device is manufactured. Thus, the components of the present embodiment that are substantially the same as those of the previous embodiment, shown in FIGS. 1 to 4, and are denoted by the same reference numeral; and detailed explanations thereof will not be repeated.

Figure 6:
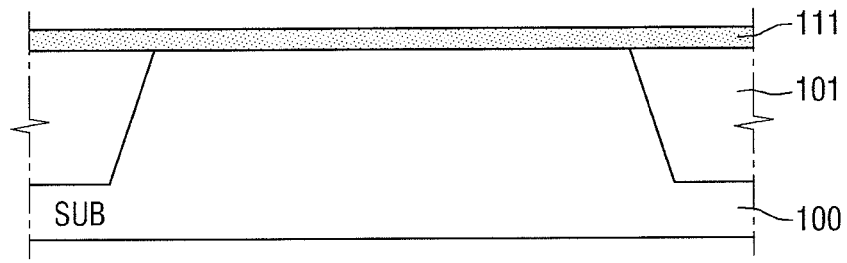
FIGS. 6 to 11 are cross-sectional views illustrating intermediate structures in the manufacture of a semiconductor device according to the second embodiment of the present inventive concepts.
Figure 7:
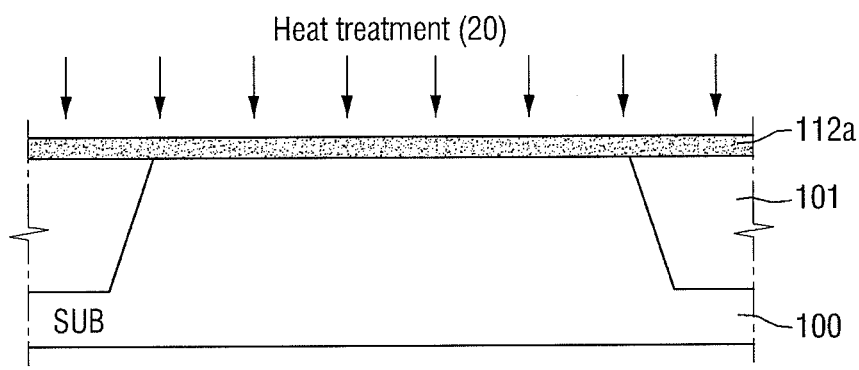
Figure 8:
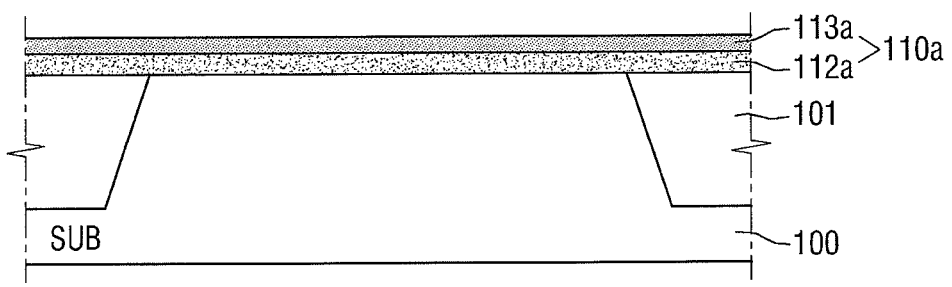

First, referring to FIGS. 5 to 8, a stacked insulation layer 110a is formed on a substrate 100 (S2010). Specifically, as shown in FIG. 6, a device isolation region 101 may be formed in the substrate 100 to define an active region. The device isolation region 101 may be a field oxide (FOX) or shallow trench isolation (STI) region formed by a local oxidation of silicon (LOCOS) method. A first high-k dielectric layer 111 is formed on the substrate 100 with the device isolation region 101 (S1010). As shown in FIG. 7, a heat treatment 20 is performed on the first high-k dielectric layer 111 to form a second high-k dielectric layer 112a (S1020). As shown in FIG. 8, a third high-k dielectric layer 113a is formed on the second high-k dielectric layer 112a to form a stacked insulation layer 110a (S1030).

Figure 9:
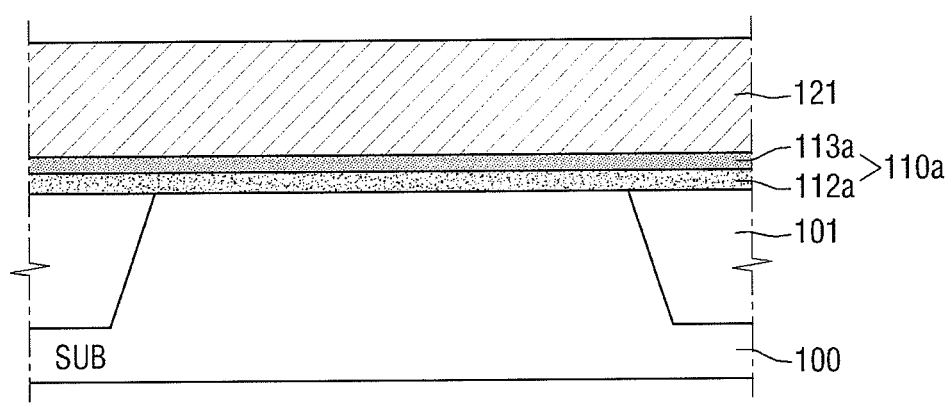
Figure 10:
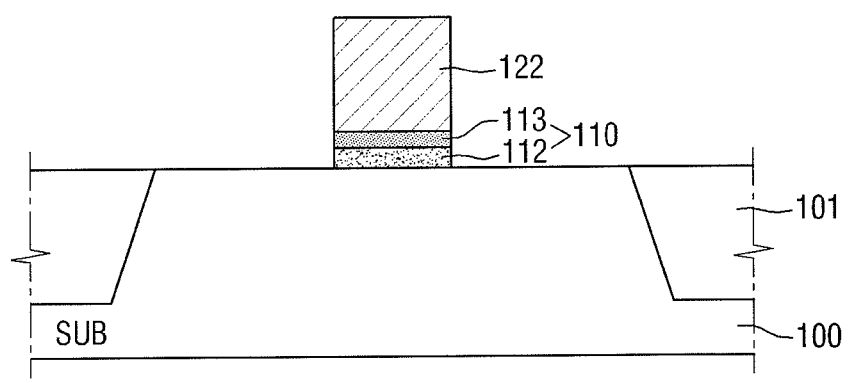

Next, referring to FIGS. 5, 9 and 10, a gate-electrode-forming conductive layer 121 is formed on the stacked insulation layer 110a. Subsequently, the second high-k dielectric layer 112a, the third high-k dielectric layer 113a and the gate electrode forming conductive layer 121 are patterned to form a gate insulation layer 110 and a gate electrode 122 (S2020).

Specifically, referring to FIG. 9, the gate-electrode-forming conductive layer 121 is deposited on the stacked insulation layer 110a (i.e., on the third high-k dielectric layer 113a), and a photoresist pattern having potential regions of a gate insulation layer and a gate electrode defined therein is formed on the gate-electrode-forming conductive layer 121. The gate-electrode-forming conductive layer 121 may be deposited on the third high-k dielectric layer 113a by chemical vapor deposition (CVD) or by sputtering and may be formed of polysilicon.

Referring to FIG. 10, the second high-k dielectric layer 112a, the third high-k dielectric layer 113a and the gate-electrode-forming conductive layer 121 are etched using the photoresist pattern as an etch mask, followed by removing the photoresist pattern to form a gate insulation layer 110 and a gate electrode 122. The etching may be dry etching or wet etching, and the photoresist pattern may be removed by general ashing or by a stripping process. Accordingly, the gate insulation layer 110 is formed, including a sequentially stacked structure of the second high-k dielectric layer 112 and the third high-k dielectric layer 113.

Figure 11:
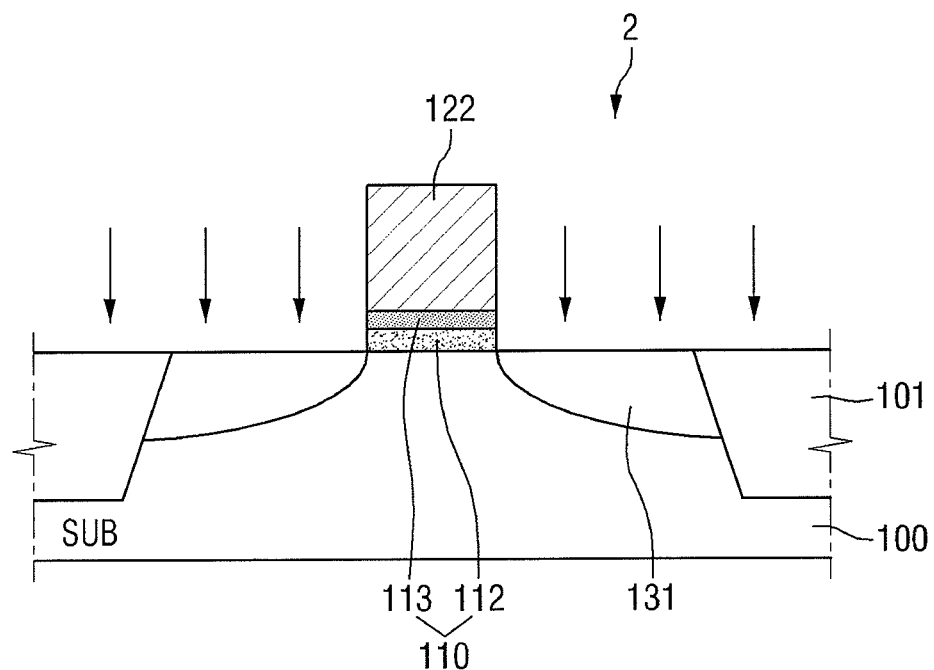

Next, referring to FIGS. 5 and 11, source and drain regions 131 are formed in the substrate 100 (S2030). Specifically, impurity ions are doped using the gate insulation layer 110 and the gate electrode 122 as masks, thereby forming the source and drain regions 131.

Although not shown, an insulation layer for forming a spacer is formed along a profile of the substrate 100 shared with the gate insulation layer 110 and the gate electrode 122. The insulation layer is anisotropically etched to form the spacer along the sidewalls of the gate insulation layer 110 and the gate electrode 122. The spacer may be formed of a material, such as silicon nitride, having high etching selectivity with respect to the gate insulation layer 110 and the gate electrode 122.

A semiconductor device manufactured according to the second embodiment of the present inventive concepts will be described with reference to FIG. 11.

The semiconductor device 2 according to the second embodiment of the present inventive concepts may include a gate insulation layer 110 formed on a substrate 100, a gate electrode 122, and source/drain regions 131 formed in the substrate 100 disposed at both sides of the gate electrode 122.

The gate insulation layer 110 has a stacked structure having a crystalline second high-k dielectric layer 112 and an amorphous third high-k dielectric layer 113 sequentially stacked. The third high-k dielectric layer 113 may be made of a material having a larger relative permittivity than that of the second high-k dielectric layer 112. Specifically, the second high-k dielectric layer 112 may be formed of crystalline hafnium oxide, and the third high-k dielectric layer may be formed of amorphous titanium oxide. In this embodiment, since the gate insulation layer 110 has a stacked structure of a crystalline high-k dielectric layer and an amorphous high-k dielectric layer, the leakage current can be reduced without increasing the EOT. In addition, where the third high-k dielectric layer 113 is made of titanium oxide, a heat treatment simultaneously performed on the first high-k dielectric layer 111 and the third high-k dielectric layer 113 may cause oxygen atoms contained in the third high-k dielectric layer 113 to migrate. Specifically, the oxygen atoms may migrate to the vicinity of the substrate 100 to form an oxide layer, thereby increasing the EOT. Before forming the third high-k dielectric layer 113 in this embodiment, however, the first high-k dielectric layer 111 is subjected to a heat treatment to form the second high-k dielectric layer 112. Thus, it is possible to prevent the EOT from increasing due to the heat treatment of the third high-k dielectric layer 113.

Figure 12:
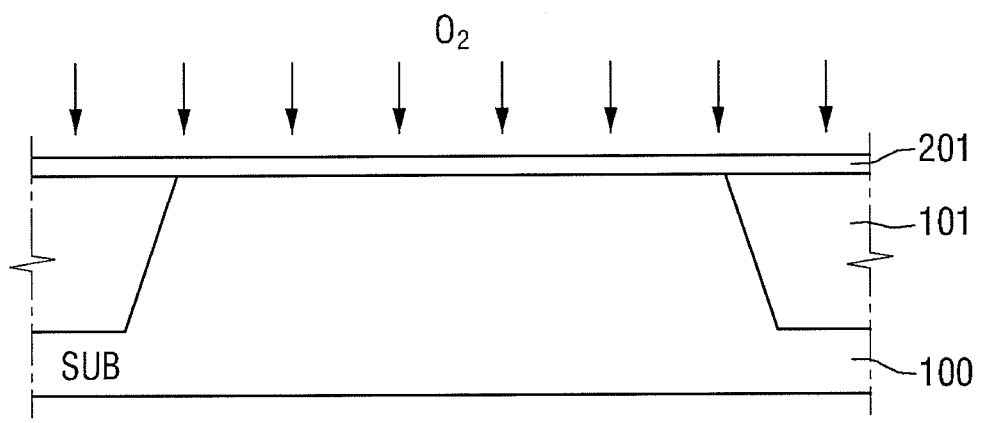
FIGS. 12 and 13 are cross-sectional views illustrating intermediate structures in the manufacture of a semiconductor device according to a third embodiment of the present inventive concepts.
Figure 13:
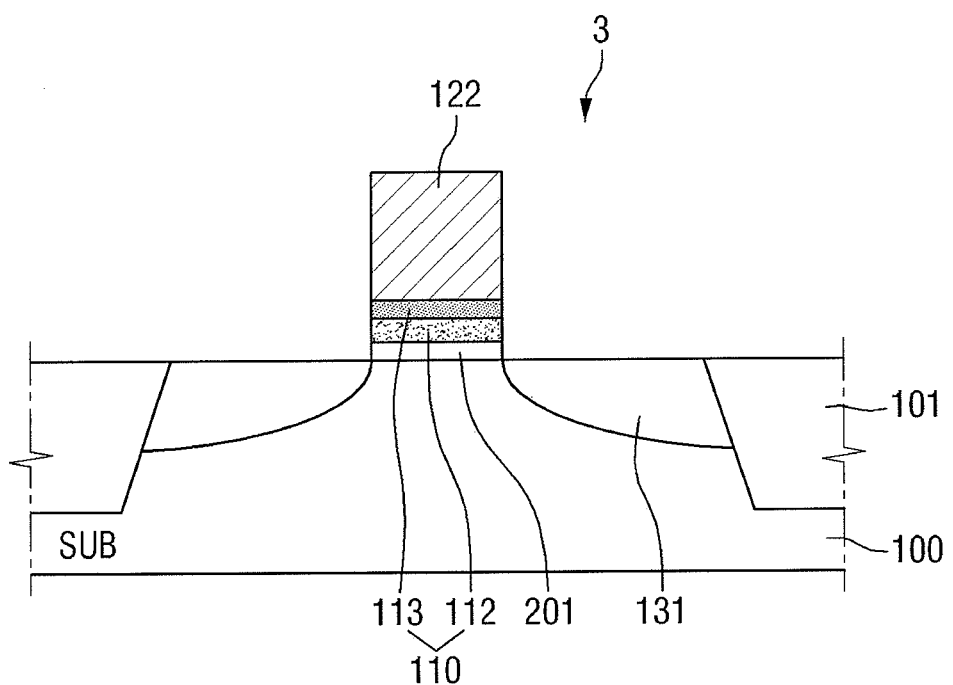

Hereinafter, a method for manufacturing a semiconductor device according to a third embodiment of the present inventive concepts will be described with reference to FIGS. 12 and 13. FIGS. 12 and 13 are cross-sectional views illustrating intermediate structures in the manufacture of a semiconductor device according to the third embodiment of the present inventive concepts. Components of the present embodiment that are substantially the same as those of the previous embodiment, shown in FIGS. 5 to 11, are denoted by the same reference numeral, and detailed explanations thereof will not be repeated.

Referring to FIG. 12, the manufacturing method according to this embodiment is different from the manufacturing method according to the second embodiment in that an interlayer interface layer 201 is formed between the substrate 100 and the gate insulation layer 110. The interlayer interface layer 201 improves the interface characteristics between the gate insulation layer 110 and the substrate 100, thereby reducing the leakage current. The interlayer interface layer 201 may be formed of a silicon oxide layer, a silicon oxynitride layer or a metal silicate oxide layer.

Specifically, the silicon oxide layer may be formed by thermally oxidizing a predetermined surface region of the substrate 100 under an oxygen atmosphere or oxidizing a predetermined region of a surface of the substrate 100 by treating the surface of the substrate 100 using a solution containing an oxygen source and ammonia ($NH_3$). The oxygen atmosphere may be created by injecting hydrogen peroxide ($H_2O_2$), ozone ($O_3$), or water vapor ($H_2O$). Hydrogen peroxide ($H_2O_2$) may be used as the oxygen source, but the oxygen source is not limited thereto. In addition, the silicon oxide layer may also be formed by ALD or CVD. For example, if the silicon oxide layer is formed by ALD, the interlayer interface layer 201 may be formed using a silicon source gas selected from $SiH_4$, $SiH_2Cl_2$, $SiHCl_3$, $SiCl_4$, $Si(OC_4H_9)_4$, $Si(OCH_3)_4$ and $Si(OC_2H_5)_4$, either alone or in a combination thereof, and an oxygen source gas selected from $H_2O$, $O_2$, $O_3$, O radical, alcohol, and $H_2O_2$, either alone or in a combination thereof.

The silicon oxynitride layer may be formed by forming the silicon oxide layer using the aforementioned method and then subjecting silicon oxide layer to nitridation or depositing silicon oxynitride by CVD. Since silicon oxynitride layer contains nitrogen, it may have an increased dielectric constant and capacitance compared to the silicon oxide layer.

The metal silicate oxide layer may be formed of a metal silicate material ($M_{1-x}Si_xO_2$). Here, the metal (M) may include hafnium (Hf), zirconium (Zr), tantalum (Ta), titanium (Ti), lanthanum (La), yttrium (Y), cerium (Ce) or aluminum (Al). The metal silicate oxide layer may be formed by depositing the metal silicate on the substrate 100 by CVD, etc., or by depositing a metal oxide layer and thermally oxidizing the same.

Referring to FIG. 13, a gate insulation layer 110 and a gate electrode 122 are formed on the interlayer interface layer 201. The gate insulation layer 110 includes a second high-k dielectric layer 112 and a third high-k dielectric layer 113, which are formed by the same method as in the second embodiment, and a detailed explanation thereof will not be repeated.

If the third high-k dielectric layer 113 is formed of titanium oxide, oxygen atoms may migrate to the vicinity of the substrate 100 to allow the interlayer interface layer 201 to grow. When the interlayer interface layer 201 grows, the EOT and leakage current may increase. In this embodiment, before forming the third high-k dielectric layer 113, the first high-k dielectric layer 111 is subjected to a heat treatment to form a crystallized second high-k dielectric layer 112. Since the third high-k dielectric layer 113 is not subjected to heat treatment, oxygen atoms do not migrate due to heat treatment, and it is therefore possible to prevent the EOT and leakage current from increasing.

A semiconductor device manufactured according to the third embodiment of the present inventive concepts will be described with reference to FIG. 13.

The semiconductor device 3 according to the third embodiment of the present inventive concepts may include an interlayer interface layer 201 formed between a gate insulation layer 110 and a substrate 100. The interlayer interface layer 201 improves interface characteristics between the gate insulation layer 110 and the substrate 100, thereby reducing the leakage current without increasing the EOT.

Figure 14:
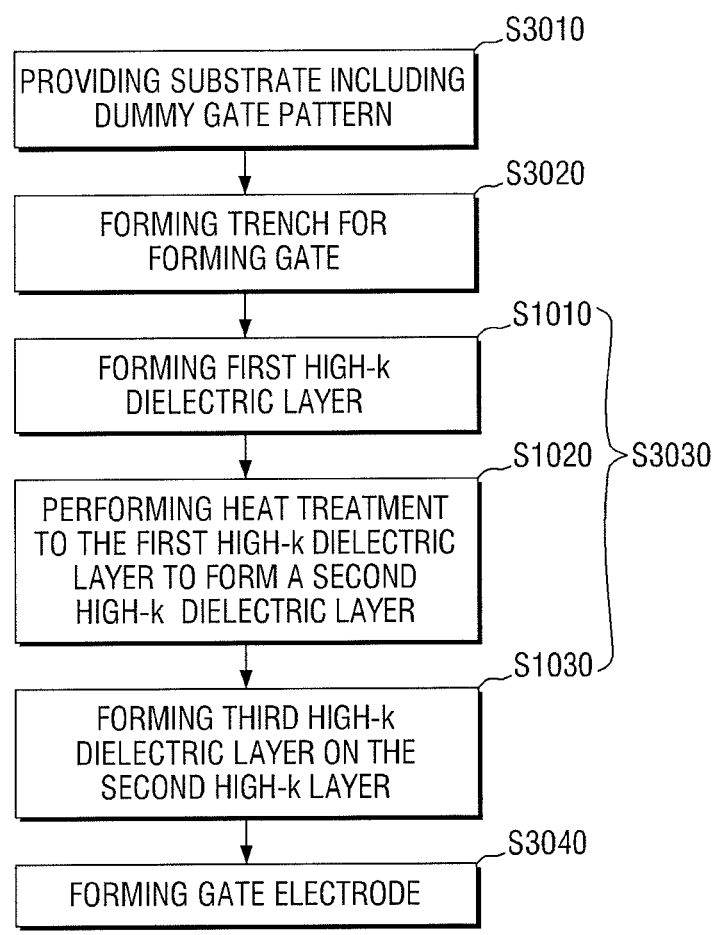
FIG. 14 is a flowchart sequentially illustrating exemplary processing steps in a method for manufacturing a semiconductor device according to a fourth embodiment of the present inventive concepts.

Hereinafter, a method for manufacturing a semiconductor device according to a fourth embodiment of the present inventive concepts will be described with reference to FIGS. 14 and 23. FIG. 14 is a flow chart sequentially illustrating exemplary processing steps in a method for manufacturing a semiconductor device according to the fourth embodiment of the present inventive concepts, and FIGS. 15 to 23 are cross-sectional views illustrating intermediate structures in the manufacture of a semiconductor device according to the fourth embodiment of the present inventive concepts. This embodiment of the method can use the steps and apparatus used in the method for manufacturing a semiconductor device according to the first embodiment of the present inventive concepts. Components of the present embodiment that are substantially the same as those of the previous embodiment, shown in FIGS. 1 to 4, are denoted by the same reference numeral, and detailed explanations thereof will not be repeated.

Figure 15:
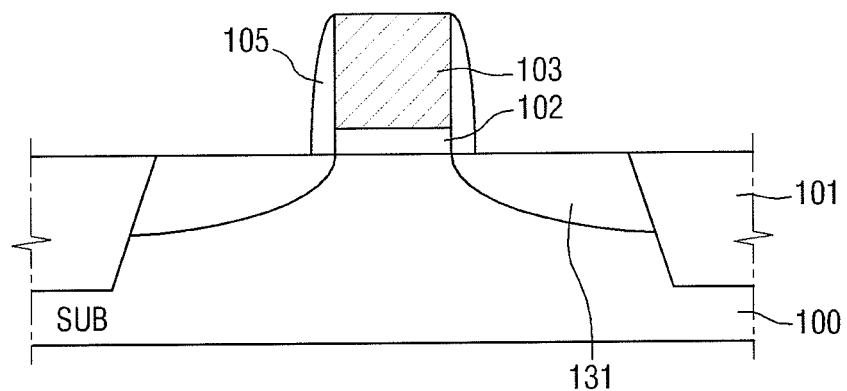
FIGS. 15 to 23 are cross-sectional views illustrating intermediate structures in the manufacture of a semiconductor device according to the fourth embodiment of the present inventive concepts.
Figure 16:
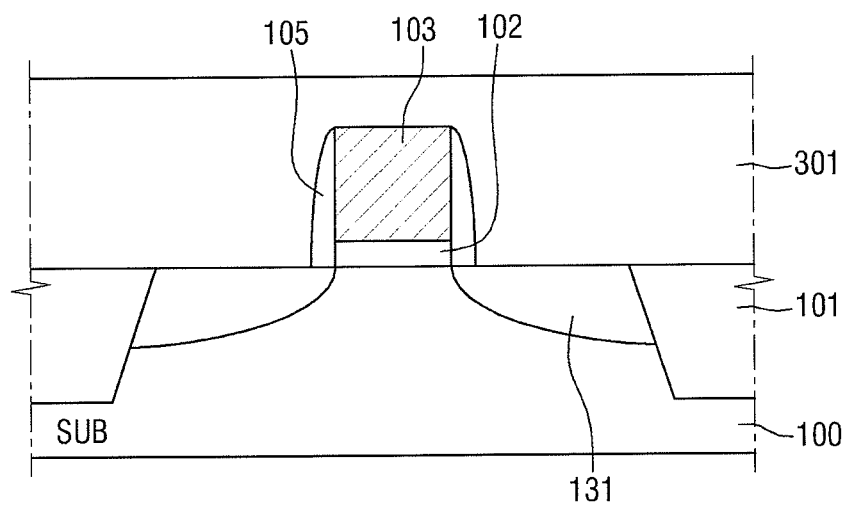

Referring to FIGS. 14 and 15, a dummy gate insulation layer pattern 102 and a dummy gate pattern 103 are formed on a substrate 100 (S3010). Specifically, a dummy gate insulation layer and a dummy gate electrode layer are sequentially formed on a substrate 100 including a device isolation region 101; and a photoresist pattern having a potential region of the dummy gate pattern defined therein is formed on the dummy gate electrode layer. The dummy gate insulation layer pattern 102 and the dummy gate pattern 103 are formed by etching the dummy gate insulation layer and the dummy gate electrode layer using the photoresist pattern as a mask; and the photoresist pattern is then removed. Subsequently, impurity ions are injected into the substrate 100 on opposite sides of the dummy gate pattern 103 to form source/drain regions 131. The dummy gate insulation layer may be formed of a silicon oxide layer by thermal oxidation, CVD or ALD. The dummy gate electrode layer may be formed of poly-Si by CVD or sputtering.

Referring to FIG. 15, an insulation layer for forming a spacer is formed along a profile of the substrate 100 on which the dummy gate pattern 103 is formed and is anisotropically etched to form the spacer 105 on the sidewalls of the dummy gate insulation layer pattern 102 and the dummy gate pattern 103. The spacer 105 may be formed of a material, such as silicon nitride, having high etching selectivity with respect to the dummy gate pattern 103.

Referring to FIGS. 14 and 16 to 18, the dummy gate insulation layer pattern 102 and the dummy gate pattern 103 are removed to form a gate-forming trench 302 (S3020). Specifically, referring to FIG. 16, an interlayer dielectric layer 301 is formed on the substrate 100 to cover the dummy gate insulation layer pattern 102 and the dummy gate pattern 103. The interlayer dielectric layer 301 may be formed of a silicon oxide layer by CVD, PVD, or the like. The interlayer dielectric layer 301 may be formed of, for example, a high-density-plasma (HDP) oxide layer. The interlayer dielectric layer 301 is formed with no step difference with respect to the top surface of the dummy gate pattern 103 via a subsequent planarization process, and the top surface of the interlayer dielectric layer 301 is higher than the top surface of the dummy gate pattern 103.

Figure 17:
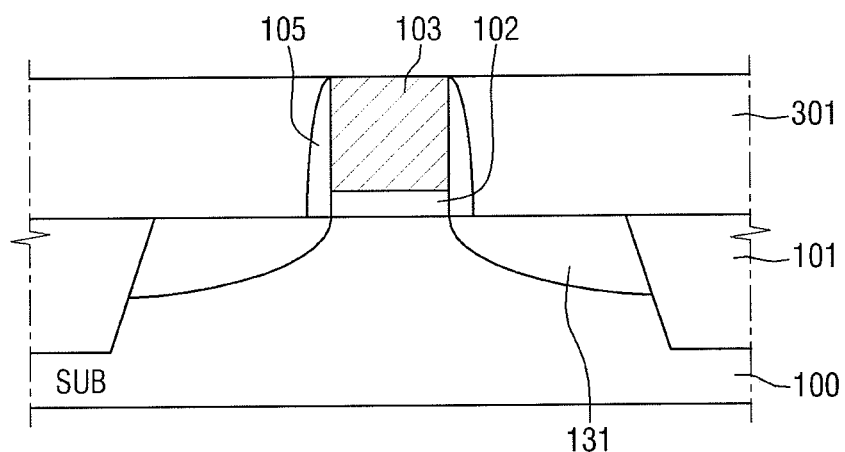

Referring to FIG. 17, the planarization process is performed until the top surface of the dummy gate pattern 103 is exposed. The planarization process may be performed by, for example, chemical mechanical polishing (CMP) or an etch-back process.

Figure 18:
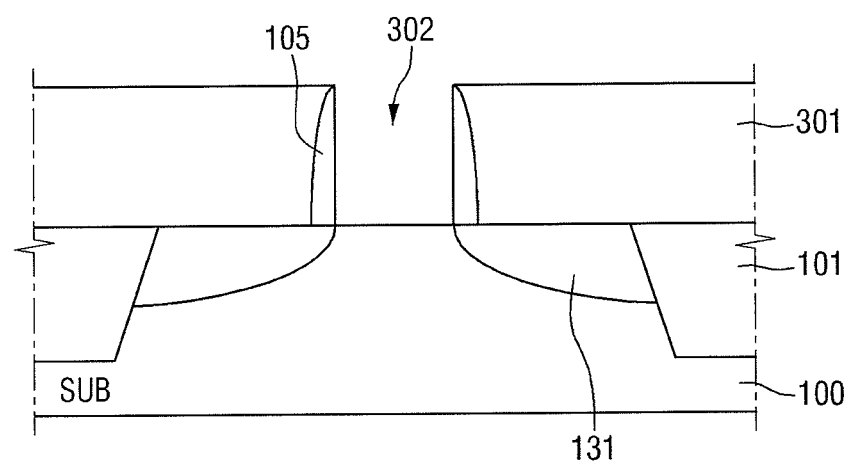

Referring to FIG. 18, the dummy gate insulation layer pattern 102 and the dummy gate pattern 103 are removed to form a gate-forming trench 302. The top surface of the substrate 100 may be exposed in the gate-forming trench 302 by removing the dummy gate insulation layer pattern 102 and the dummy gate pattern 103 by, e.g., a reactive ion etching method.

Referring to FIGS. 14 and 19 to 21, a stacked insulation layer 110a is formed in the gate-forming trench 302 (S3030).

Figure 19:
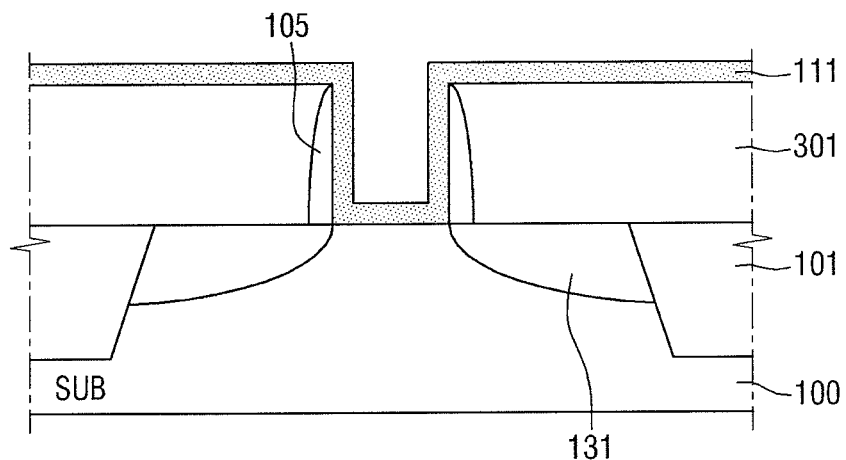
Figure 20:
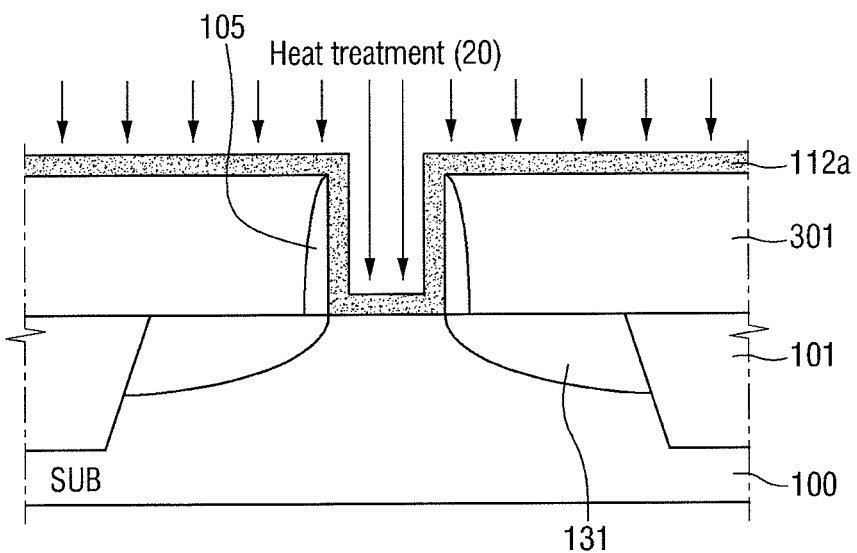
Figure 21:
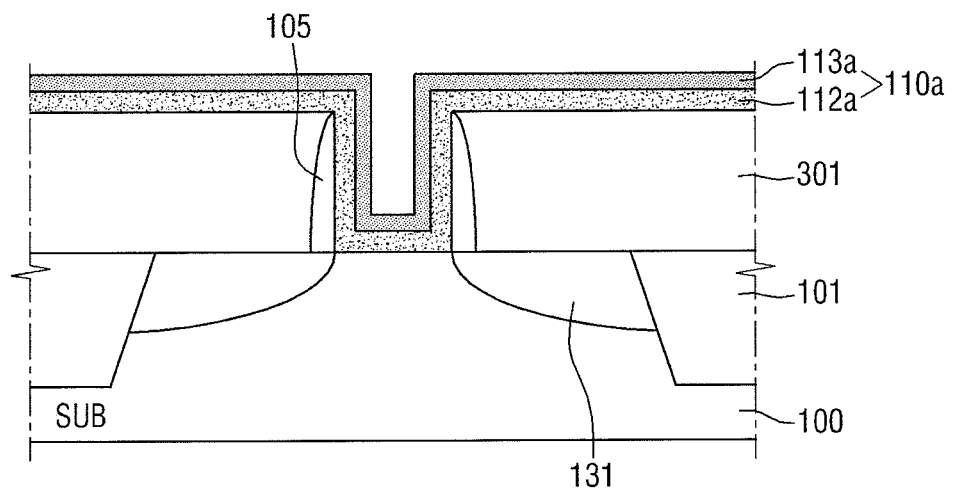

Specifically, referring to FIGS. 14, 18 and 19, a first high-k dielectric layer 111 is formed within the gate forming trench 302 (S1010). The first high-k dielectric layer 111 may be formed by depositing a high-k material in the gate-forming trench 302 by CVD or ADL. Here, the first high-k dielectric layer 111 is formed along the top surface of the substrate 100 exposed in the gate-forming trench 302 and along the sidewalls of the gate-forming trench 302 and on the interlayer dielectric layer 301. Referring to FIGS. 14 and 20, a heat treatment 20 is performed on the first high-k dielectric layer 111 to form a second high-k dielectric layer 112a (S1020). Referring to FIGS. 14 and 21, a third high-k dielectric layer 113a is formed on the second high-k dielectric layer 112a (S1030). The third high-k dielectric layer 113a is formed by depositing a high-k material on the second high-k dielectric layer 112a by CVD or ALD. Here, the third high-k dielectric layer 113a is formed along the sidewalls of the gate forming trench 302 and on the interlayer dielectric layer 301. By the above-described procedure, a stacked insulation layer 110a is formed with the second high-k dielectric layer 112a and the third high-k dielectric layer 113a sequentially stacked.

Figure 22:
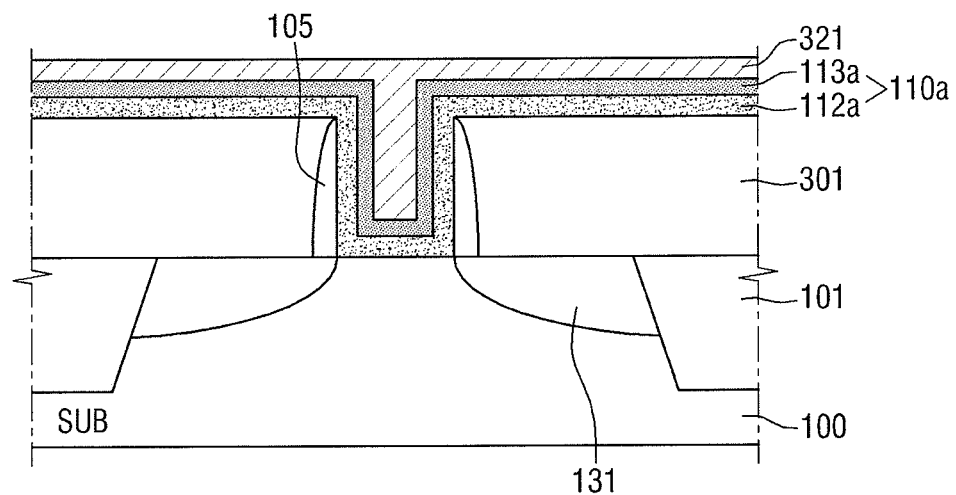
Figure 23:
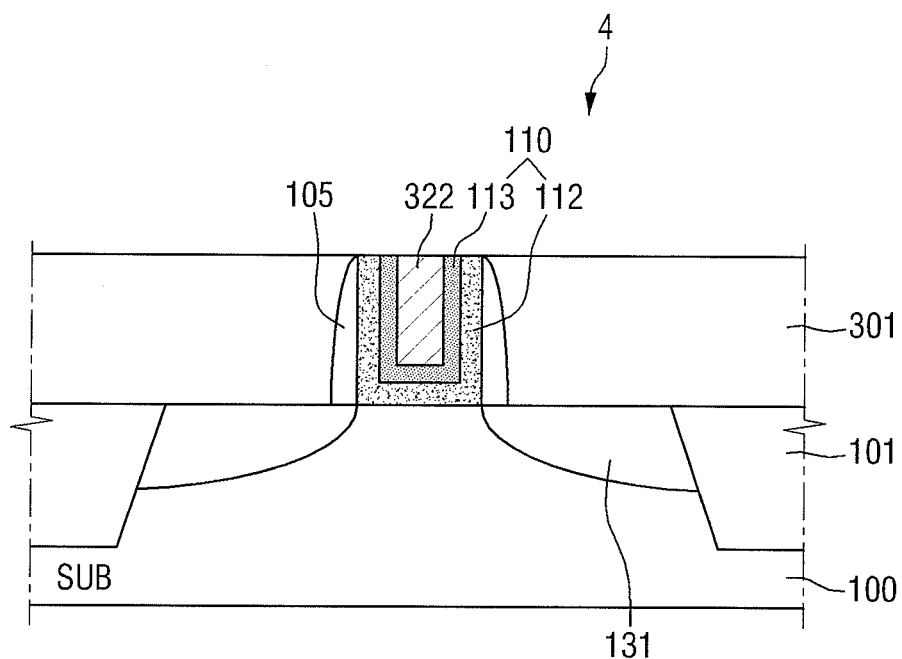

Next, referring to FIGS. 14, 22 and 23, a gate electrode 322 filling the gate-forming trench 302 is formed (S3040). Specifically, referring to FIG. 22, a metal gate-forming conductive layer 321 is formed, filling the gate-forming trench 302 and coating the third high-k dielectric layer 113a. The gate-forming conductive layer 321 may be formed of aluminum, tungsten or molybdenum deposited by PVD, sputtering, or CVD. The gate-forming conductive layer 321 may also be formed on the interlayer dielectric layer 301 while filling the gate-forming trench 302.

Referring to FIG. 23, a planarization process is performed while removing the gate-forming conductive layer 321 formed on the interlayer dielectric layer 301, thereby forming a gate electrode 322. The planarization process may be performed by, for example, CMP or an etch back process. The height of the gate forming trench 302 may be lowered by the planarization process.

A semiconductor device manufactured according to a fourth embodiment of the present inventive concepts will be described with reference to FIG. 23.

The semiconductor device 4 according to the fourth embodiment of the present inventive concepts may include an interlayer dielectric layer 301 formed on the substrate 100, a gate electrode 322 and a gate insulation layer 110. The gate insulation layer 110 is formed within the surrounding sidewalls of the interlayer dielectric layer 301 and the bottom surface of the gate electrode 322 and has a stacked structure including a crystalline second high-k dielectric layer 112 and an amorphous third high-k dielectric layer 113. With this structure, the gate insulation layer 110 of the semiconductor device 4 according to this embodiment may reduce the leakage current without decreasing the EOT.

Figure 24:
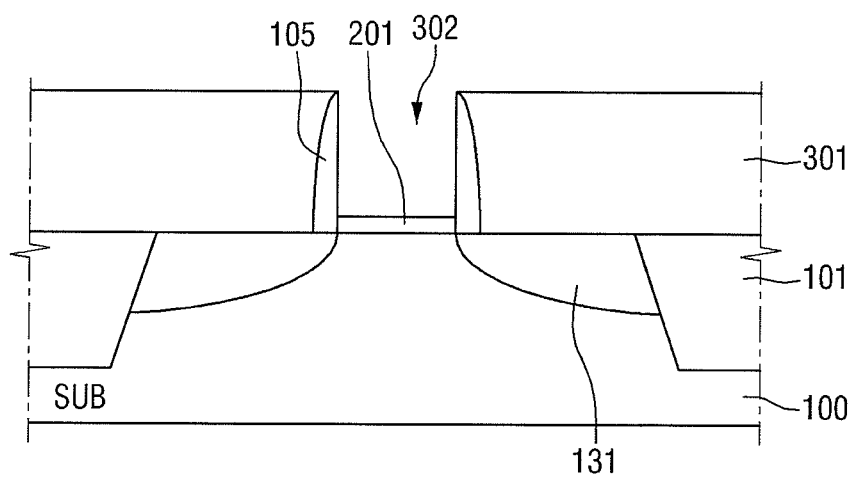
FIGS. 24 and 25 are cross-sectional views illustrating intermediate structures in the manufacture of a semiconductor device according to a fifth embodiment of the present inventive concepts.
Figure 25:
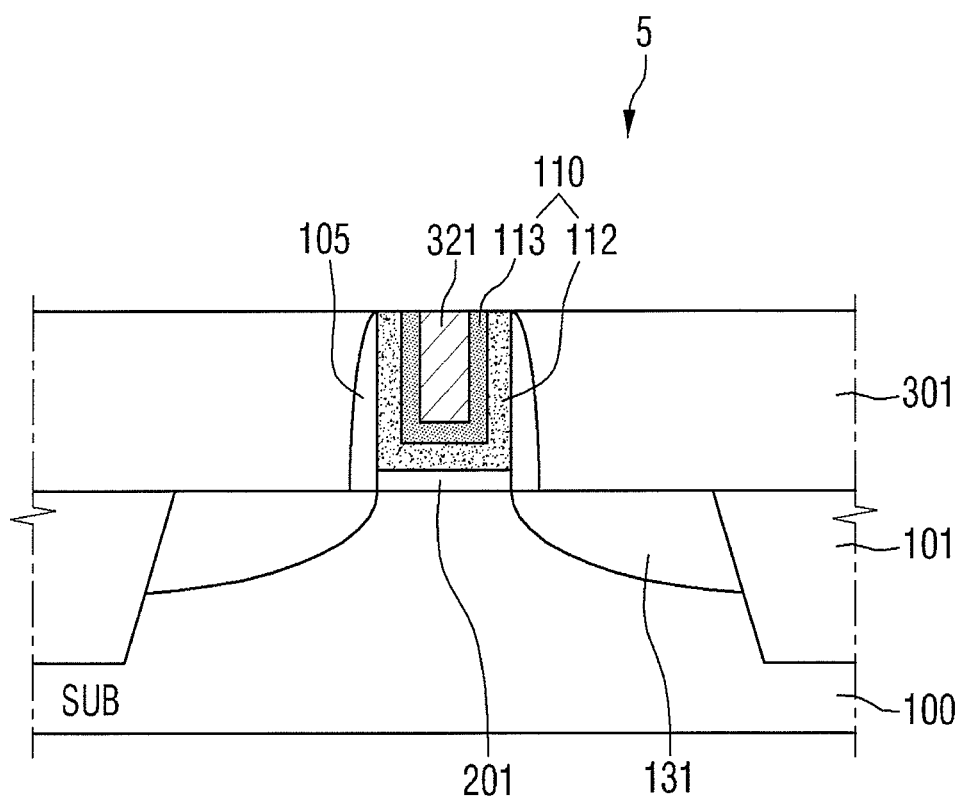

Hereinafter, a method for manufacturing a semiconductor device according to a fifth embodiment of the present inventive concepts will be described with reference to FIGS. 24 and 25. FIGS. 24 and 25 are cross-sectional views illustrating intermediate structures in the manufacture of a semiconductor device according to the fifth embodiment of the present inventive concepts. Components of the present embodiment that are substantially the same as those of the previous embodiment, shown in FIGS. 14 to 23, are denoted by the same reference numeral, and detailed explanations thereof will not be repeated.

Referring to FIG. 24, the manufacturing method according to this embodiment is different from the manufacturing method according to the fourth embodiment in that an interlayer interface layer 201 is formed within the gate forming trench 302. Specifically, the interlayer interface layer 201 may be formed by oxidizing a surface of the substrate 100 exposed in the gate-forming trench 302. The interlayer interface layer 201 may also be formed by performing nitridation after the oxidation. Here, the interlayer interface layer 201 is not formed on the interlayer dielectric layer 301 and is only formed within the gate forming trench 201. In addition, the interlayer interface layer 201 may be formed within the gate-forming trench 302 by CVD, for example. In the CVD process, although not shown, the interlayer interface layer 201 may be formed along the profile of an internal sidewall and of the interlayer dielectric layer 301.

A semiconductor device 5 manufactured according to the fifth embodiment of the present inventive concepts will be described with reference to FIG. 25. The semiconductor device 5 according to the fifth embodiment of the present inventive concepts may include an interlayer dielectric layer 301 formed on a substrate 100, a gate insulation layer 110 formed within the interlayer dielectric layer 301, a gate electrode 322 and an interlayer interface layer 201.

The gate insulation layer 110 and the gate electrode 322 are formed within the gate-forming trench 302 on the interlayer interface layer 201. The interlayer interface layer 201 is formed within the interlayer dielectric layer 301 between the gate insulation layer 110 and the substrate 100. The interlayer interface layer 201 improves interface characteristics between the gate insulation layer 110 and the substrate 100, thereby reducing the leakage current.

Embodiments of the present inventive concepts will hereinafter be further described via Examples and Comparative Examples. These examples, however, are illustrative of the present inventive concepts, and are not intended to be limiting of the present inventive concepts.

Experimental Example

Evaluation of EOT and Leakage Current

Insulation layers were formed on a substrate in the following manner:

(1) amorphous hafnium oxide was formed on a substrate by ALD and then subjected to a rapid thermal anneal (RTA) process (Comparative Example 1);

(2) amorphous hafnium oxide was formed on a substrate by ALD, and amorphous titanium oxide was then formed on the amorphous hafnium oxide by ALD (Comparative Example 2);

(3) amorphous hafnium oxide was formed on a substrate by ALD, and amorphous titanium oxide was then formed on the amorphous hafnium oxide by ALD; subsequently, the amorphous hafnium oxide and the amorphous titanium oxide were simultaneously subject to a rapid thermal anneal (RTA) process (Comparative Example 3); and (4) amorphous hafnium oxide was formed on a substrate by ALD and then subjected to a RTA process, and amorphous titanium oxide was formed on the amorphous hafnium oxide by ALD (Example 1).

The EOT and leakage current of each of the insulation layers formed in Comparative Examples 1 to 3 and Example 1 were evaluated, and the evaluation results are listed in Table 1, below.

TABLE 1

|  | Example 1 | Comparative Example 1 | Comparative Example 2 | Comparative Example 3 |
|---|---|---|---|---|
| EOT(Å) | 7.12 | 7.52 | 8.00 | 13.13 |
| leakage current(A/µm$^2$) | $2.3 \times 10^{-10}$ | $2.8 \times 10^{-9}$ | $6.5 \times 10^{-10}$ | $1.1 \times 10^{-10}$ |

As shown in Table 1, the insulation layers in Example 1, which were manufactured according to embodiments of the present inventive concepts, had EOT and leakage current levels that were generally reduced in comparison with the insulation layers manufactured according to Comparative Examples 1 to 3, particularly in view of the tendency of the leakage current to decrease with an increase in EOT. The leakage current in Example 1 was reduced to one tenth (1/10) or less compared to the leakage current in Comparative Example 1, which had a slightly greater EOT.

While the present inventive concepts has been particularly shown and described with reference to exemplary embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A manufacturing method of a semiconductor device, comprising:
providing a substrate having a dummy gate pattern;
forming a gate-forming trench with sidewalls and a bottom surface by removing the dummy gate pattern;
forming a stacked insulation layer within the gate-forming trench, wherein the formation of the stacked insulation layer comprises:
forming a first high-k dielectric layer on the sidewalls and bottom surface of the gate-forming trench;
forming a second high-k dielectric layer by performing heat treatment on the first high-k dielectric layer; and
after the heat treatment, forming a third high-k dielectric layer on the second high-k dielectric layer, the third high-k dielectric layer having a higher relative permittivity than the second high-k dielectric layer and having a dielectric constant of 40 or higher;
forming a gate electrode on the third high-k dielectric layer within the gate-forming trench; and
wherein the second high-k dielectric layer is thicker than the third high-k dielectric layer.

2. The manufacturing method of claim 1, wherein the first high-k dielectric layer is stacked in an amorphous state and is crystallized by the heat treatment to form the second high-k dielectric layer.

3. The manufacturing method of claim 2, wherein the second high-k dielectric layer includes a crystal form selected from a monoclinic crystal system, a tetragonal crystal system, a hexagonal crystal system and a cubic system, either alone or in combination.

4. The manufacturing method of claim 1, wherein the first high-k dielectric layer includes hafnium oxide, and the third high-k dielectric layer includes titanium oxide.

5. The manufacturing method of claim 1, wherein the third high-k dielectric layer is formed in an amorphous state.

6. The manufacturing method of claim 1, further comprising forming an interlayer interface layer between the substrate and the first high-k dielectric layer.

7. The manufacturing method of claim 6, wherein the interlayer interface layer is selected from silicon oxide, silicon oxynitride and metal silicate oxide, either alone or in combination.

8. The manufacturing method of claim 6, wherein the formation of the interlayer interface layer comprises oxidizing a predetermined region of the substrate.

9. The manufacturing method of claim 6, wherein the formation of the interlayer interface layer comprises injecting nitrogen into the oxide layer after forming an oxide layer by oxidizing the predetermined region of the substrate.

10. The manufacturing method of claim 1, wherein the third high-k dielectric layer is in direct contact with the second high-k dielectric layer.

11. The manufacturing method of claim 1, wherein the first high-k dielectric layer and the third high-k dielectric layer are formed by atomic layer deposition.

12. The manufacturing method of claim 1, wherein the substrate comprises at least one of silicon on insulator, gallium arsenic, silicon germanium, a ceramic material, quartz, and a display glass.

13. The manufacturing method of claim 1, wherein the second high-k dielectric layer comprises an oxide of at least one of Hf, Zr, Al, La, Y, Gd and Ta.

14. The manufacturing method of claim 13, wherein the third high-k dielectric layer comprises at least one of titanium oxide ($TiO_x$), titanium strontium oxide ($SrTiO_x$), and barium titanium oxide ($BaTiO_x$).

15. The manufacturing method of claim 1, wherein the third high-k dielectric layer is formed along a profile of the second high-k dielectric layer.

* * * * *